United States Patent
Taniguchi et al.

(10) Patent No.: US 7,002,396 B2
(45) Date of Patent: Feb. 21, 2006

(54) FREQUENCY CONVERTER

(75) Inventors: Eiji Taniguchi, Tokyo (JP); Chiemi Sawaumi, Tokyo (JP); Noriharu Suematsu, Tokyo (JP); Kenichi Maeda, Tokyo (JP); Takayuki Ikushima, Tokyo (JP); Hiroyuki Joba, Tokyo (JP); Yoshinori Takahashi, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 99 days.

(21) Appl. No.: 10/481,877

(22) PCT Filed: Mar. 15, 2002

(86) PCT No.: PCT/JP02/02518

§ 371 (c)(1),
(2), (4) Date: Dec. 31, 2003

(87) PCT Pub. No.: WO03/079538

PCT Pub. Date: Sep. 25, 2003

(65) Prior Publication Data

US 2004/0170032 A1    Sep. 2, 2004

(51) Int. Cl.
*G06F 7/44*    (2006.01)

(52) U.S. Cl. ............... 327/359; 323/217; 323/323; 327/65; 363/134

(58) Field of Classification Search ........ 327/356–359, 327/65–67, 355, 238, 254; 323/217, 213, 323/323, 218; 307/271, 288; 363/134
See application file for complete search history.

(56) References Cited

U.S. PATENT DOCUMENTS

| 4,216,431 A | * | 8/1980 | Shibata et al. ............... 455/333 |
| 5,736,840 A | * | 4/1998 | Otaka et al. ................. 323/217 |
| 6,759,887 B1 | * | 7/2004 | Takahashi et al. ........... 327/359 |

FOREIGN PATENT DOCUMENTS

| EP | 0 416 889 A2 | 3/1991 |
| EP | 1 133 051 A1 | 9/2001 |
| JP | 10-224152 | 8/1998 |
| JP | 11-17454 | 1/1999 |
| JP | 11-17455 | 1/1999 |
| JP | 2000-165148 | 6/2000 |
| WO | 03/009465 | 1/2003 |

* cited by examiner

Primary Examiner—Rajnikant B. Patel
(74) Attorney, Agent, or Firm—Oblon, Spivak, McClelland, Maier & Neustadt, P.C.

(57) ABSTRACT

A frequency converter includes a transistor pair having a first transistor and a second transistor respectively having collector terminals commonly connected to each other and emitter terminals commonly connected to each other, the commonly-connected collector terminals of the transistor pair being connected to a power supply terminal by way of a first resistor, a third transistor having a collector terminal connected to the power supply terminal by way of a second resistor and an emitter terminal connected to the commonly-connected emitter terminals of the transistor pair, a third resistor having an end connected to the commonly-connected emitter terminals of the transistor pair, and another end grounded by way of a constant current source, and an output terminal connected to the commonly-connected collector terminals of the transistor pair. The frequency converter can exhibit an excellent saturation characteristic and an excellent distortion characteristic even when operating from a low voltage and/or a low current.

18 Claims, 13 Drawing Sheets

FREQUENCY CONVERTER

FIELD OF THE INVENTION

The present invention relates to a frequency converter that multiplies the frequency of a high-frequency signal, such as a UHF, microwave, or millimeter wave, by a certain factor, or mixes high-frequency signals with each other in a wideband communication terminal or the like that conforms to a communication system such as a WCDMA system.

BACKGROUND OF THE INVENTION

FIG. 1 is a schematic circuit diagram showing the structure of a prior art frequency converter. In the figure, reference numeral 1 denotes a power supply terminal to which a DC voltage Vcc is applied, reference numerals 2a and 2b denote transistors each used for input of a local oscillation (LO) signal, reference numeral 3a denotes a reference transistor, reference numeral 5 denotes a constant current source, reference numerals 6a and 6b denote load resistors, reference numeral 7a denotes a radio frequency (RF) signal input terminal, reference numerals 8a and 8b denote local oscillation (LO) signal input terminals, reference numeral 9 denotes a reference bias terminal, reference numerals 10a and 10b denote output terminals, reference numeral 11a denotes a transistor pair that consists of the LO signal input transistors 2a and 2b, and reference numeral 14 denotes a transistor for input of a radio frequency (RF) signal. As shown in FIG. 1, in the prior art frequency converter, an RF signal is applied to the emitter-grounded RF signal input transistor 14.

Next, a description will be made as to an operation of the prior art frequency converter.

A DC voltage Vcc, which is applied to the power supply terminal 1 of the prior art frequency converter as shown in FIG. 1, is then applied to the transistor pair 11a that consists of the two LO signal input transistors 2a and 2b and the RF signal input transistor 14, and the reference transistor 3a by way of the two load resistors 6a and 6b, respectively. The constant current source 5 supplies a constant current to a parallel circuit that consists of the transistor pair 11a and the reference transistor 3a by way of the RF signal input transistor 14. A bias current is supplied to the reference transistor 3a by way of the reference bias terminal 9.

The RF signal input transistor 14 amplifies an RF signal that is applied to the base terminal thereof by way of the RF signal input terminal 7a. On the other hand, the LO signal input transistor 2a amplifies an LO signal of positive phase that is applied to the base terminal thereof by way of the LO signal input terminal 8a, and the other LO signal input transistor 2b amplifies another LO signal of negative phase that is applied to the base terminal thereof by way of the other LO signal input terminal 8b. Thus, because the LO signal of positive phase and the other LO signal of negative phase are applied to the base terminals of the LO signal input transistors 2a and 2b, respectively, the transistor pair 11a in which the collector terminals of these transistors are commonly connected to each other and the emitter terminals of these transistors are commonly connected to each other generates a signal having a frequency that is two times as high as that of the LO signals.

The sum of an electric current that flows through the transistor pair 11a and an electric current that flows through the reference transistor 3a is equal to an electric current that flows through the RF signal input transistor 14, and is therefore equal to an electric current output from the constant current source 5 connected to the emitter terminal of the RF signal input transistor 14. Because while the signal generated by the transistor pair 11a and having a frequency that is two times as high as that of the LO signals changes the electric current that flows through the transistor pair 11a, the RF signal input transistor 14 operates from the constant current from the constant current source 5, a signal having a phase opposite to that of a change in the electric current that flows through the transistor pair 11a flows through the reference transistor 3a. Therefore, the prior art frequency converter as shown in FIG. 1 serves as an even order harmonics frequency converter having a gain, which mixes the RF signal amplified by the RF signal input transistor 14, the signal generated by the transistor pair 11a and having a frequency that is two times as high as that of the LO signals, and the negative-phase signal that flows through the reference transistor 3a, and outputs the mixed signal as a differential signal by way of the output terminals 10a and 10b respectively connected to the load resistors 10a and 10b.

A problem with the prior art frequency converter constructed as previously mentioned is that the saturation and distortion characteristics of the frequency converter are determined by the large signal characteristic of the RF signal input transistor 14 that is an active element, and therefore the saturation and distortion characteristics cannot be easily improved and degrade remarkably when the prior art frequency converter operates from a low voltage and/or a low current.

The present invention is proposed to solve the above-mentioned problem, and it is therefore an object of the present invention to provide a frequency converter that can exhibit an excellent saturation characteristic and an excellent distortion characteristic even when operating from a low voltage and/or a low current because of a resistor that is a passive element and is disposed in an RF signal input circuit instead of a transistor.

DISCLOSURE OF THE INVENTION

In accordance with the present invention, there is provided a frequency converter including: a transistor pair having a first transistor and a second transistor respectively having first terminals commonly connected to each other and second terminals commonly connected to each other, the commonly-connected first terminals (referred to as a first common terminal from here on) being connected to a power supply terminal by way of a first passive element; a third transistor having a first terminal connected to the power supply terminal by way of a second passive element, and a second terminal connected to the commonly-connected second terminals (referred to as a second common terminal from here on) of the first and second transistors of the transistor pair; a third passive element having an end connected to the second common terminal of the transistor pair, and another end directly or indirectly grounded; and an output terminal connected to the first common terminal of the transistor pair, a first signal being applied to a third terminal of the first transistor, a second signal having a phase opposite to that of the first signal being applied to a third terminal of the second transistor, a third signal being applied to the second common terminal of the transistor pair, and a reference signal being applied to a third terminal of the third transistor.

As a result, the frequency converter can exhibit an excellent saturation characteristic and an excellent distortion characteristic even when operating from a low voltage and/or a low current.

The frequency converter in accordance with the present invention can include another output terminal connected to the first terminal of the third transistor.

As a result, the frequency converter can remove the in-phase component included in unnecessary frequency components of the output signal.

In the frequency converter in accordance with the present invention, the first to third passive elements are resistors. In the frequency converter in accordance with the present invention, the first to third passive elements are inductors. As a result, each transistor included in the frequency converter can be made to operate in a linear region without increase in a voltage that appears between the first and second terminals of each transistor.

The frequency converter in accordance with the present invention can include a constant current source connected between the other end of the third passive element and a ground.

As a result, the frequency converter can have a voltage conversion gain.

In the frequency converter in accordance with the present invention, each of the first to third transistors is a bipolar junction transistor having a collector terminal as the first terminal, an emitter terminal as the second terminal, and a base terminal as the third terminal.

In the frequency converter in accordance with the present invention, each of the first to third transistors is a field effect transistor having a drain terminal as the first terminal, a source terminal as the second terminal, and a gate terminal as the third terminal.

In accordance with the present invention, there is provided a frequency converter including: a first transistor pair having a first transistor and a second transistor respectively having first terminals commonly connected to each other and second terminals commonly connected to each other, the commonly-connected first terminals (referred to as a first common terminal from here on) being connected to a power supply terminal by way of a first passive element; a third transistor having a first terminal directly or indirectly connected to the power supply terminal, and a second terminal connected to the commonly-connected second terminals (referred to as a second common terminal from here on) of the first and second transistors of the first transistor pair; a second passive element having an end connected to the second common terminal of the first transistor pair, and another end directly or indirectly grounded; a first output terminal connected to the first common terminal of the first transistor pair; a second transistor pair having a fourth transistor and a fifth transistor respectively having first terminals commonly connected to each other and second terminals commonly connected to each other, the commonly-connected first terminals (referred to as a first common terminal from here on) being connected to the power supply terminal by way of a third passive element; a sixth transistor having a first terminal directly or indirectly connected to the power supply terminal, and a second terminal connected to the commonly-connected second terminals (referred to as a second common terminal from here on) of the fourth and fifth transistors of the second transistor pair; a fourth passive element having an end connected to the second common terminal of the second transistor pair, and another end directly or indirectly grounded; and a second output terminal connected to the first common terminal of the second transistor pair, a first signal being applied to third terminals of the first and fifth transistors, a second signal having a phase opposite to that of the first signal being applied to third terminals of the second and fourth transistors, a third signal being applied to the second common terminal of the first transistor pair, a fourth signal having a phase opposite to that of the third signal being applied to the second common terminal of the second transistor pair, and a reference signal being applied to third terminals of the third and sixth transistors.

As a result, the frequency converter can exhibit an excellent saturation characteristic and an excellent distortion characteristic even when operating from a low voltage and/or a low current. The frequency converter can further suppress the odd order harmonics of the third signal, and a mixture of even order components of the first signal and even order components of the third signal.

In the frequency converter in accordance with the present invention can, the first terminal of the third transistor is connected to the power supply terminal by way of the fifth passive element, and the first terminal of the sixth transistor is connected to the power supply terminal by way of the sixth passive element.

In the frequency converter in accordance with the present invention can, the first terminal of the third transistor is connected to the second output terminal and is also connected to the power supply terminal by way of the third passive element, and the first terminal of the sixth transistor is connected to the first output terminal and is also connected to the power supply terminal by way of the first passive element.

As a result, the circuit structure of the frequency converter can be simplified, and the second order component of the first signal can be further suppressed.

In the frequency converter in accordance with the present invention can, the first to fourth passive elements are resistors.

In the frequency converter in accordance with the present invention, the first to fourth passive elements are inductors.

As a result, each transistor included in the frequency converter can be made to operate in a linear region without increase in a voltage that appears between the first and second terminals of each transistor.

In the frequency converter in accordance with the present invention, the first to sixth passive elements are resistors. In the frequency converter in accordance with the present invention, the first to sixth passive elements are inductors. As a result, each transistor included in the frequency converter can be made to operate in a linear region without increase in a voltage that appears between the first and second terminals of each transistor.

The frequency converter in accordance with the present invention can include a constant current source connected between the other ends of the third and fourth passive element and a ground.

As a result, the frequency converter can have a voltage conversion gain.

The frequency converter in accordance with the present invention can include a resistor connected between the other ends of the third and fourth passive element and a ground. As a result, variations in the performance of the frequency converter due to temperature variations can be prevented because no constant current source is used.

In the frequency converter in accordance with the present invention, each of the first to sixth transistors is a bipolar junction transistor having a collector terminal as the first terminal, an emitter terminal as the second terminal, and a base terminal as the third terminal.

In the frequency converter in accordance with the present invention, each of the first to sixth transistors is a field effect transistor having a drain terminal as the first terminal, a source terminal as the second terminal, and a gate terminal as the third terminal.

PREFERRED EMBODIMENTS OF THE INVENTION

In order to explain the present invention in greater detail, the preferred embodiments will be described below with reference to the accompanying figures.

Embodiment 1.

Figure 1:
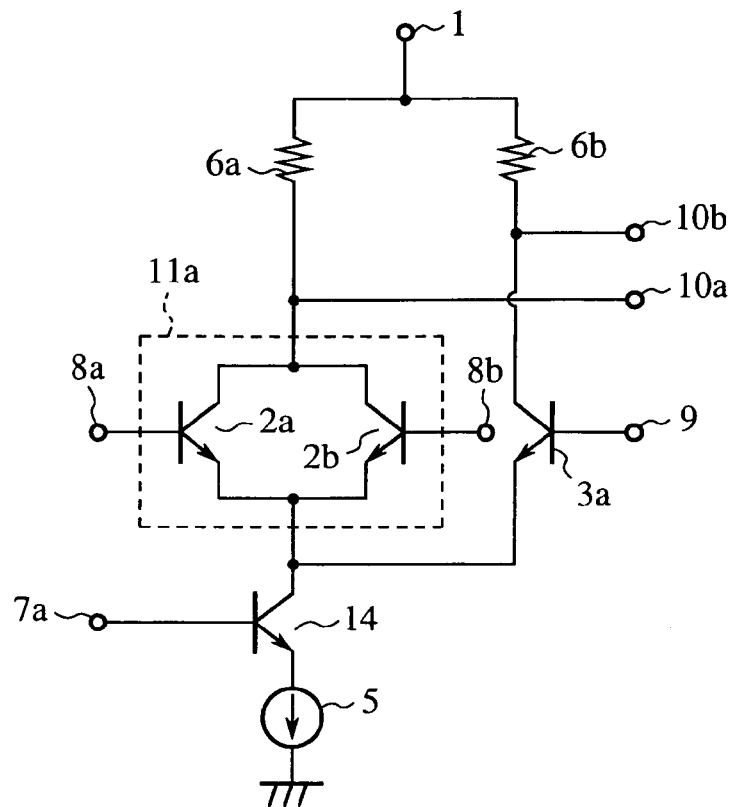
FIG. 1 is a schematic circuit diagram showing the structure of a prior art frequency converter.
Figure 2:
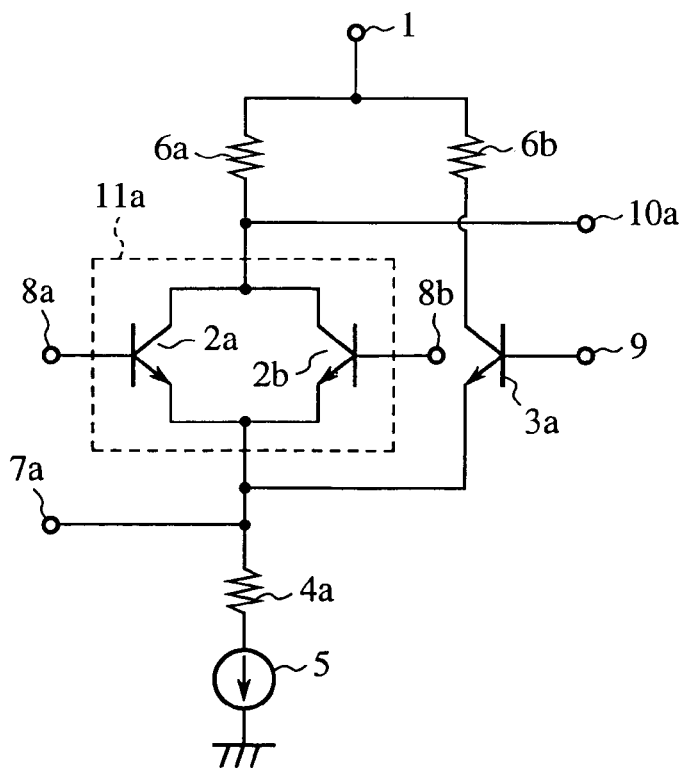
FIG. 2 is a schematic circuit diagram showing the structure of a frequency converter in accordance with embodiment 1 of the present invention.

FIG. 2 is a schematic circuit diagram showing the structure of a frequency converter in accordance with embodiment 1 of the present invention. In the figure, reference numeral 1 denotes a power supply terminal to which a DC voltage Vcc is applied, reference numerals 2a and 2b denote transistors (i.e., first and second transistors) each used for input of a local oscillation (LO) signal, reference numeral 3a denotes a reference transistor (i.e., a third transistor) used for input of a reference signal, reference numeral 4a denotes a resistor (i.e., a third passive element) used for input of a radio frequency (RF) signal, reference numeral 5 denotes a constant current source, reference numerals 6a and 6b denote load resistors (i.e., first and second passive elements), reference numeral 7a denotes a radio frequency (RF) signal input terminal, reference numerals 8a and 8b denote local oscillation (LO) signal input terminals, reference numeral 9 denotes a reference bias terminal to which the reference signal is applied, reference numeral 1a denotes an output terminal, and reference numeral 11a denotes a transistor pair that consists of the LO signal input transistors 2a and 2b each used for input of an LO signal.

As shown in FIG. 2, the LO signal input transistors 2a and 2b, which constitute the transistor pair 11a, have collector terminals (i.e., first terminals) that are commonly connected to each other, and emitter terminals (i.e., second terminals) that are commonly connected to each other, respectively. The RF signal input terminal 7a, one end of the RF signal input resistor 4a and an emitter terminal of the reference transistor 3a are connected to the emitter terminals (referred to as a common emitter terminal (i.e., a second common terminal) from here on) of the LO signal input transistors 2a and 2b, which are commonly connected to each other. Another end of the RF signal input resistor 4a is connected to a ground by way of the constant current source 5.

The collector terminals (referred to as a common collector terminal (i.e., a first common terminal) from here on) of the LO signal input transistors 2a and 2b, which are commonly connected to each other, are connected to the output terminal 10a and one end of the load resistor 6a, and another end of the load resistor 6a is connected to the power supply terminal 1. One end of the other load resistor 6b is connected to the power supply terminal 1, and another end of the other load resistor 6b is connected to a collector terminal of the reference transistor 3a. Furthermore, base terminals of the LO signal input transistors 2a and 2b are connected to the LO signal input terminals 8a and 8b, respectively, and a base terminal of the reference transistor 3a is connected to the reference bias terminal 9.

Next, a description will be made as to an operation of the frequency converter in accordance with embodiment 1 of the present invention.

The frequency converter in accordance with this embodiment 1 mixes an RF signal (i.e., a third signal) applied thereto by way of the RF signal input terminal 7a and a signal having a frequency that is two times as high as those of an LO signal of positive phase (i.e., a first signal) applied thereto by way of the LO signal input terminal 8a and another LO signal of negative phase (i.e., a second signal) applied thereto by way of the other LO signal input terminal 8b, the signal being generated by the transistor pair 11a from the LO signal of positive phase and the other LO signal of negative phase, so as to generate a mixed signal, and then outputs the mixed signal by way of the output terminal 10a.

A DC voltage Vcc applied to the power supply terminal 1 of the frequency converter is then applied to both the transistor pair 11a, which consists of the LO signal input transistors 2a and 2b, and the reference transistor 3a by way of the two load resistors 6a and 6b. Constant currents are supplied from the constant current source 5 to the LO signal input transistors 2a and 2b and the reference transistor 3a, respectively. A bias current (i.e., a reference signal) is supplied to the base terminal of the reference transistor 3a by way of the reference bias terminal 9.

The LO signal input transistor 2a amplifies the LO signal of positive phase applied to the base terminal thereof by way of the LO signal input terminal 8a. Similarly, the LO signal input transistor 2b amplifies the other LO signal of negative phase applied to the base terminal thereof by way of the LO input terminal 8b. Thus, because the LO signal of positive phase and the other LO signal of negative phase are applied to the base terminals of the two LO signal input transistors 2a and 2b, respectively, the transistor pair 11a in which the collector terminals of those transistors 2a and 2b are commonly connected to each other and the emitter terminals of those transistors 2a and 2b are also commonly connected to each other generates a signal having a frequency that is two times as high as that of the two LO signals.

The sum of an electric current that flows through the transistor pair 11a and an electric current that flows through the reference transistor 3a is equal to an electric current that flows through the RF signal input resistor 4a, i.e., an electric current output from the constant current source 5. Therefore, because the signal having a frequency that is two times as high as that of the LO signals and generated by the transistor pair 11a causes a change in the electric current that flows through the transistor pair 11a while the electric current that flows in the entire parallel circuit consists of the transistor pair 11a and the reference transistor 3a, i.e., the electric current that flows through the RF signal input resistor 4a is maintained constant by the constant current source 5, a signal having a phase opposite to that of the change in the electric current that flows through the transistor pair 11a flows through the reference transistor 3a. Therefore, the frequency converter in accordance with this embodiment 1 serves as an even order harmonics frequency converter that outputs, as an intermediate frequency (IF) signal, a mixed signal (e.g., a signal having a frequency of $(f_{RF}-2f_{LO})$, where $f_{RF}$ is the frequency of the RF signal and $f_{LO}$ is the frequency of the LO signals), into which the RF signal, the positive-phase signal having a frequency that is two times as high as that of the LO signals and generated by the transistor pair 11 and the negative-phase signal flowing through the reference transistor 3a are mixed, by way of the output terminal 10a connected between the load resistor 6a and the common collector terminal of the transistor pair 11a.

The frequency converter in accordance with this embodiment 1 can thus exhibit a high saturation characteristic and a high distortion characteristic because it does not use, as the RF signal input element, any transistor that is an active element. When the resistances of the load resistors 6a and 6b are suitably set and the electric current output from the constant current source 5 is suitably set, the frequency converter in accordance with this embodiment 1 can also have a voltage conversion gain.

The frequency converter in accordance with this embodiment 1 is not limited to the above-mentioned downconverter and can be alternatively an upconverter that outputs a mixed signal into which an IF signal applied to the RF signal input terminal instead of the RF signal, the positive-phase signal having a frequency that is two times as high as that of the LO signals and generated by the transistor pair 11 and the negative-phase signal flowing through the reference transistor 3a are mixed, e.g., an RF signal having a frequency of $(f_{IF}+2f_{LO})$ ($f_{IF}$ is the frequency of the IF signal) by way of the output terminal 10a.

As mentioned above, because the frequency converter in accordance with this embodiment 1 does not use, as the RF signal input element, any transistor that is an active element, this embodiment offers an advantage of being able to exhibit a high saturation characteristic and a high distortion characteristic.

Figure 3:
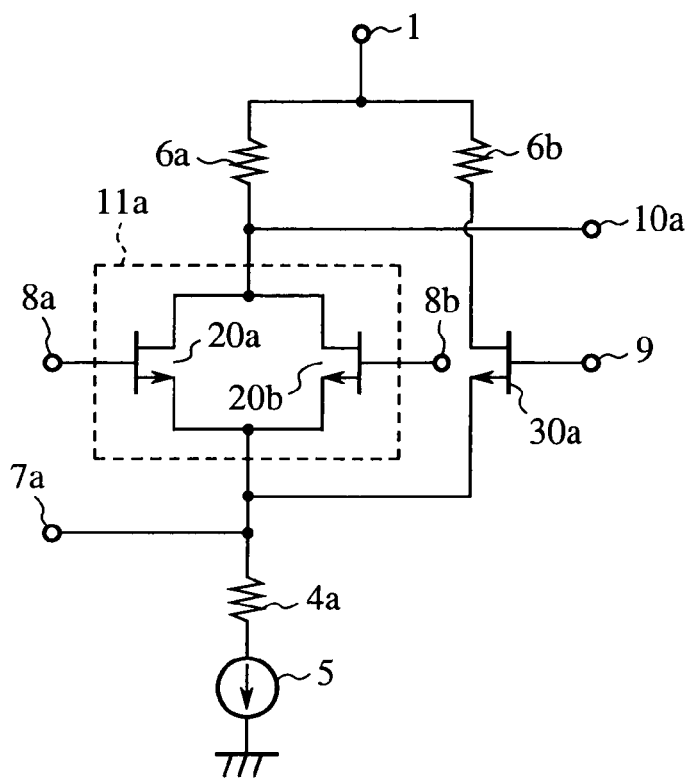
FIG. 3 is a schematic circuit diagram showing the structure of a frequency converter in accordance with a variant of embodiment 1 of the present invention.

Numerous variants can be made in this embodiment 1 mentioned above. FIG. 3 is a schematic circuit diagram showing the structure of a frequency converter in accordance with a variant of embodiment 1. In this variant, the transistor pair 11a consists of two field-effect transistors 20a and 20b, and a reference field-effect transistor 30a used for input of a reference signal is disposed instead of the reference transistor 3a. In this case, the collector terminal, emitter terminal, and base terminal of each bipolar junction transistor of FIG. 2 are replaced by the drain terminal, source terminal, and gate terminal of each field-effect transistor.

Figure 4:
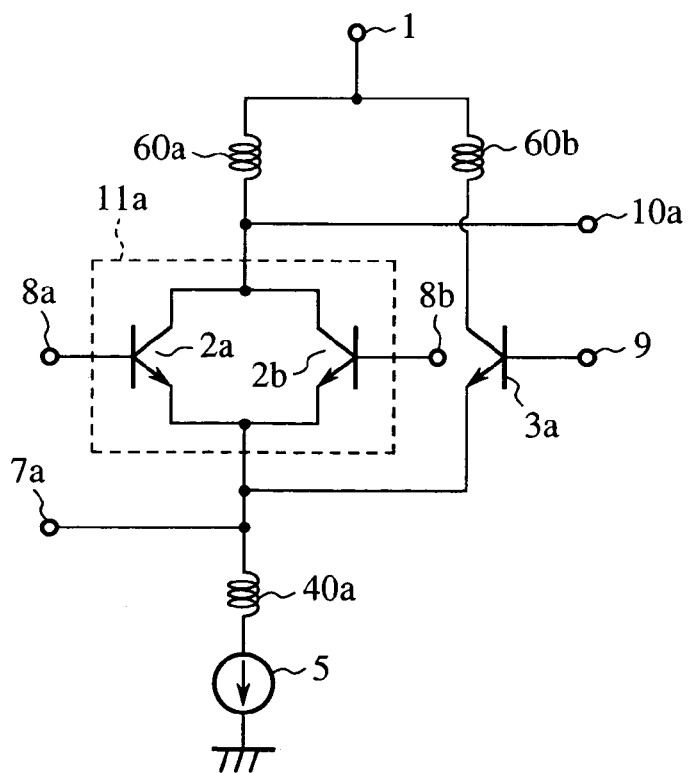
FIG. 4 is a schematic circuit diagram showing the structure of a frequency converter in accordance with another variant of embodiment 1 of the present invention.
Figure 5:
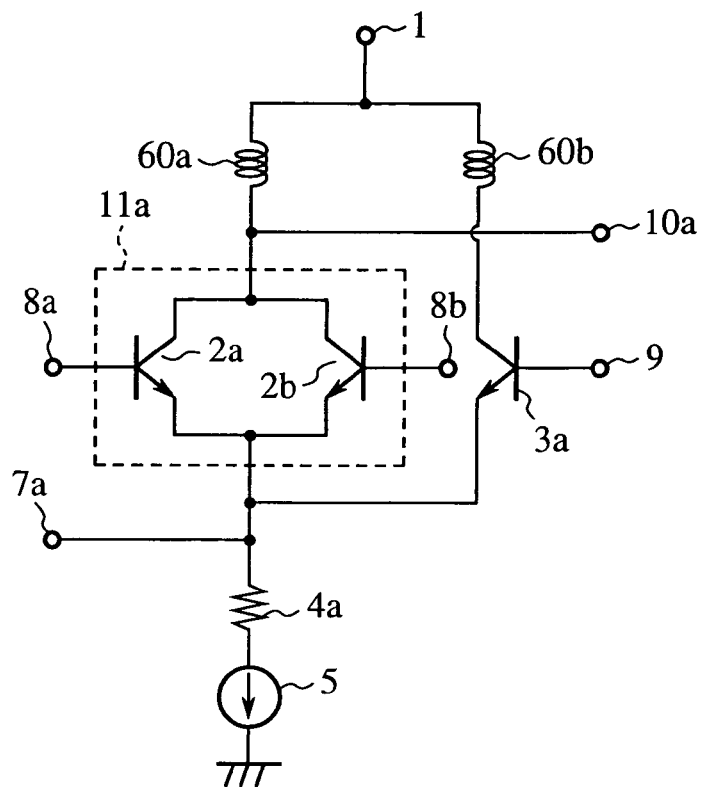
FIG. 5 is a schematic circuit diagram showing the structure of a frequency converter in accordance with another variant of embodiment 1 of the present invention.
Figure 6:
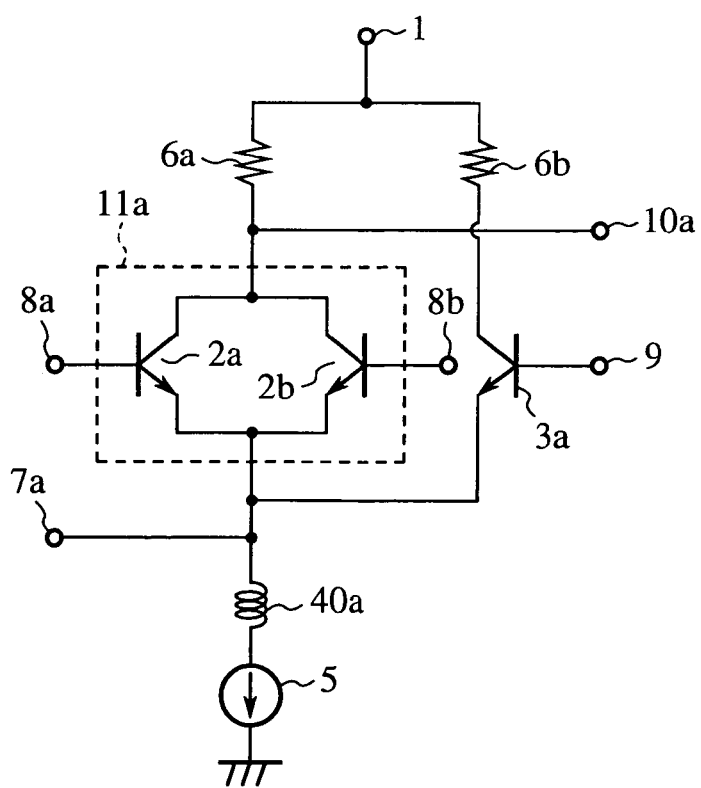
FIG. 6 is a schematic circuit diagram showing the structure of a frequency converter in accordance with another variant of embodiment 1 of the present invention.

FIG. 4 is a schematic circuit diagram showing the structure of a frequency converter in accordance with another variant of embodiment 1. In this variant, the load resistors 6a and 6b, and the RF signal input resistor 4a are replaced by inductors 60a, 60b, and 40a, respectively. As a result, even though a DC bias electric current increases, each transistor included in the frequency converter can be made to operate in a linear region without increase in the collector-emitter voltage of each transistor. All the resistors of the frequency converter need not be replaced by inductors. For example, as shown in FIGS. 5 and 6, only either of the load resistors 6a and 6b and the RF signal input resistor 4a may be replaced by inductors.

Figure 7:
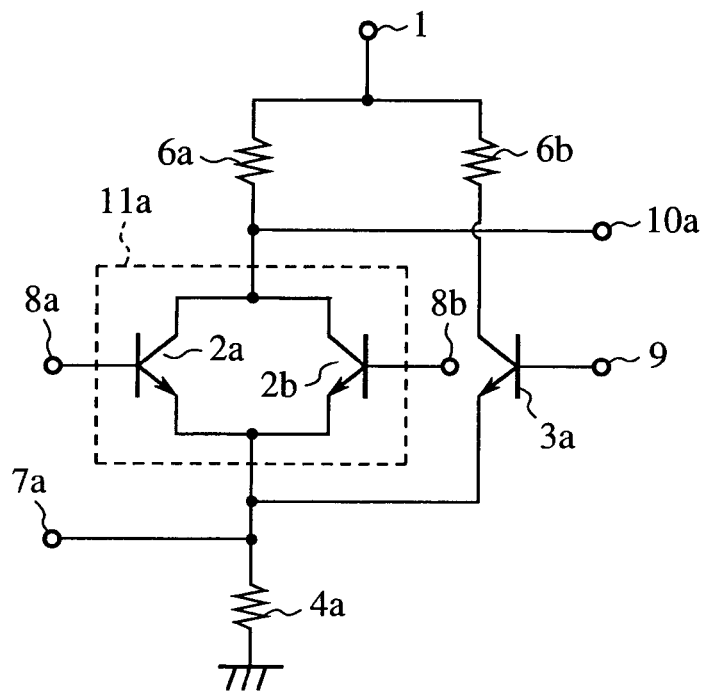
FIG. 7 is a schematic circuit diagram showing the structure of a frequency converter in accordance with another variant of embodiment 1 of the present invention.

FIG. 7 is a schematic circuit diagram showing the structure of a frequency converter in accordance with another variant of embodiment 1. In this variant, the constant current source 5 is omitted, and the other end of the RF signal input resistor 4a is connected directly with the ground. Thus, even when the frequency converter does not include the constant current source 5, because the electric current flowing through the entire parallel circuit that consists of the transistor pair 11a and the reference transistor 3a is maintained constant by both the DC voltage Vcc applied to the power supply terminal 1 and the RF signal input resistor 4a, the same advantage is provided.

Embodiment 2.

Figure 8:
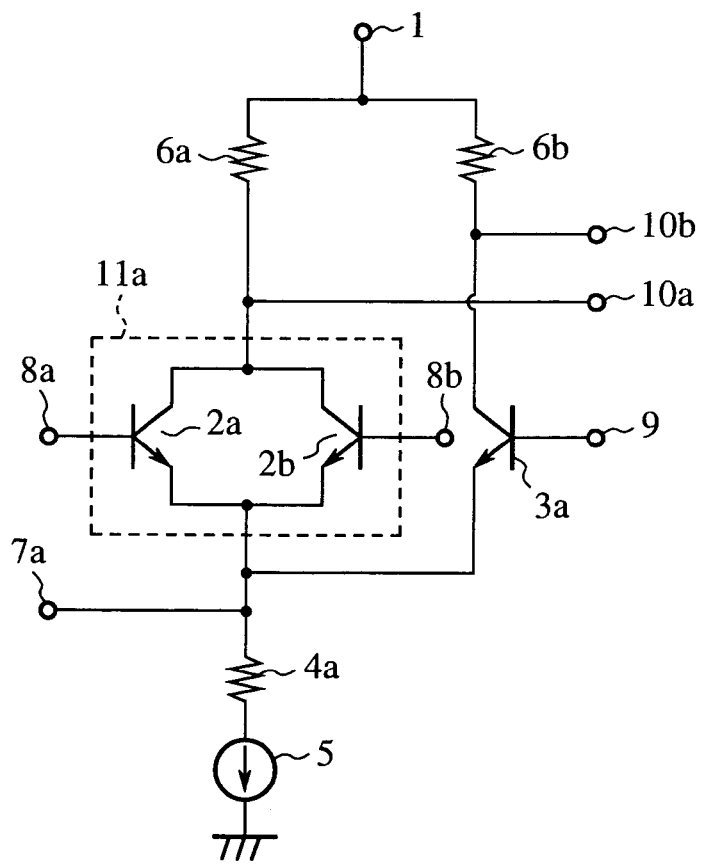
FIG. 8 is a schematic circuit diagram showing the structure of a frequency converter in accordance with embodiment 2 of the present invention.

FIG. 8 is a schematic circuit diagram showing the structure of a frequency converter in accordance with embodiment 2 of the present invention. In the figure, the same reference numerals as shown in FIG. 2 denotes the same components as those of the frequency converter in accordance with above-mentioned embodiment 1 or like components, and therefore the explanation of those components will be omitted hereafter. Furthermore, in FIG. 8, reference numeral 10b denotes a second output terminal connected between a load resistor 6b and a collector terminal of a reference transistor 3b.

Next, a description will be made as to an operation of the frequency converter in accordance with embodiment 2 of the present invention.

The frequency converter in accordance with this embodiment 2 operates basically in the same way that that in accordance with above-mentioned embodiment 1 does. Next, only a characterized operation of the frequency converter in accordance with this embodiment 2 will be explained.

The frequency converter in accordance with this embodiment 2 outputs, as an output signal, a differential signal by way of a differential terminal pair that consists of a first output terminal 10a and the second output terminal 10b. As a result, the frequency converter in accordance with this embodiment 2 can remove the in-phase component included in unnecessary frequency components of the output signal.

Numerous variants can be made in this embodiment 2, as in the case of above-mentioned embodiment 1. A transistor pair 11a consists of two field-effect transistors 20a and 20b, and a reference field-effect transistor 30a used for input of a reference signal is disposed instead of a reference transistor 3a, as in the case as shown in FIG. 3. In this case, the collector terminal, emitter terminal, and base terminal of each bipolar junction transistor of FIG. 8 are replaced by the drain terminal, source terminal, and gate terminal of each field-effect transistor.

In another variant, load resistors 6a and 6b, and an RF signal input resistor 4a are replaced by inductors 60a, 60b, and 40a, respectively, as in the case as shown in FIG. 4. As a result, even though a DC bias electric current increases, each transistor included in the frequency converter can be made to operate in a linear region without increase in the collector-emitter voltage of each transistor. All resistors of the frequency converter need not be replaced by inductors. For example, as in the cases as shown in FIGS. 5 and 6, only either of the load resistors 6a and 6b and the RF signal input resistor 4a may be replaced by inductors.

In another variant, a constant current source 5 is omitted, and an end of the RF signal input resistor 4a is connected directly with a ground, as in the case as shown in FIG. 7. Thus, even when the frequency converter does not include the constant current source 5, because an electric current flowing through an entire parallel circuit that consists of the transistor pair 11a and the reference transistor 3a is maintained constant by both a DC voltage Vcc applied to a power supply terminal 1 and the RF signal input resistor 4a, the same advantage is provided.

Embodiment 3.

Figure 9:
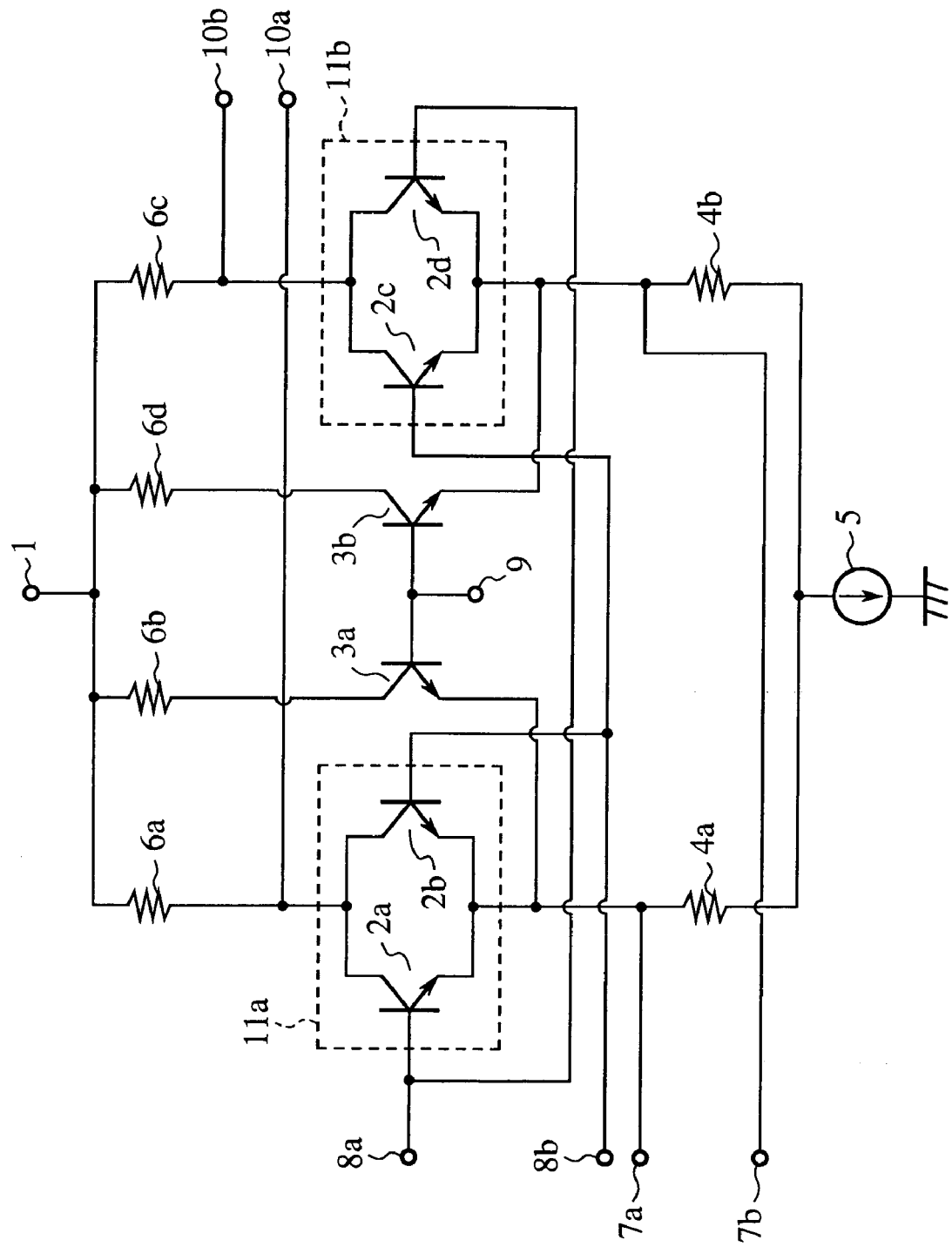
FIG. 9 is a schematic circuit diagram showing the structure of a frequency converter in accordance with embodiment 3 of the present invention.

FIG. 9 is a schematic circuit diagram showing the structure of a frequency converter in accordance with embodiment 3 of the present invention. In the figure, the same reference numerals as shown in FIG. 8 denotes the same components as those of the frequency converter in accordance with above-mentioned embodiment 2 or like components, and therefore the explanation of those components will be omitted hereafter. In FIG. 9, reference numerals 2c and 2d denote LO signal input transistors (i.e., fourth and fifth transistors) each used for input of a local oscillation (LO) signal, reference numeral 3b denotes a second reference transistor (i.e., a sixth transistor) used for input of a reference signal, reference numeral 4b denotes a second RF signal input resistor (i.e., a fourth passive element) used for input of a radio frequency (RF) signal, reference numerals 6c and 6d denote load resistors, reference numeral 7b denotes a second radio frequency (RF) signal input terminal, and reference numeral 11b denotes a second transistor pair that consists of the LO signal input transistors 2c and 2d.

As shown in FIG. 9, in the frequency converter in accordance with this embodiment 3, two parallel circuits, each of which is the same as that as shown in FIG. 8 that constitutes the frequency converter in accordance with above-mentioned embodiment 2, are connected in parallel between a power supply terminal 1 and a ground. A first RF signal input terminal 7a is connected between a first RF signal input resistor 4a (i.e., a second passive element) and a common emitter terminal of a first transistor pair 11a. On the other hand, the second RF signal input terminal 7b is connected between the second RF signal input resistor 4b and a common emitter terminal of the second transistor pair 11b. An LO signal input terminal 8a is connected to a base terminal of an LO signal input transistor 2a of the first transistor pair 11a and a base terminal of the LO signal input transistor 2d of the second transistor pair 11b. On the other hand, another LO signal input terminal 8b is connected to a base terminal of another LO signal input transistor 2b of the first transistor pair 11a and a base terminal of the other LO signal input transistor 2c of the second transistor pair 11b. A first output terminal 10a is connected between a load resistor 6a (i.e., a first passive element) and a common collector terminal of the first transistor pair 11a. On the other hand, a second output terminal 10b is connected between the load resistor 6c (i.e., a third passive element) and a common collector terminal of the second transistor pair 11b. Furthermore, a first reference transistor 3a and the second reference transistor 3b have base terminals connected commonly with a reference bias terminal 9, collector terminals connected to the power supply terminal 1 by way of the load resistors 6b and 6d (i.e., fifth and sixth passive elements), respectively, and emitter terminals connected to the common emitter terminals of the first and second transistor pairs 11a and 11b, respectively.

Next, a description will be made as to an operation of the frequency converter in accordance with embodiment 3 of the present invention.

The frequency converter in accordance with this embodiment 3 operates basically in the same way that that in accordance with above-mentioned embodiment 2 does. Next, only a characterized operation of the frequency converter in accordance with this embodiment 3 will be explained.

An RF signal (i.e., a third signal) of positive phase is applied to the common emitter terminal of the first transistor pair 11a by way of the first RF signal input terminal 7a, and another RF signal (i.e., a fourth signal) of negative phase is applied to the common emitter terminal of the second transistor pair 11b by way of the second RF signal input terminal 7b. Therefore, the frequency converter in accordance with this embodiment 3 serves as an even order harmonics frequency converter that outputs, as an intermediate frequency (IF) signal, a differential signal consisting of both a mixed signal (e.g., a signal having a frequency of $(f_{RF}-2f_{LO})$, where $f_{RF}$ is the frequency of the RF signals and $f_{LO}$ is the frequency of the LO signals), into which the RF signal of positive phase, a positive-phase signal having a frequency that is two times as high as that of the LO signals and generated by the first transistor pair 11a and a negative-phase signal flowing through the first reference transistor 3a are mixed, and a mixed signal (e.g., a signal having a frequency of $(f_{RF}-2f_{LO})$, into which the other RF signal of negative phase, a positive-phase signal having a frequency that is two times as high as that of the LO signals and generated by the second transistor pair 11b and a negative-phase signal flowing through the second reference transistor 3b are mixed, by way of the first and second output terminals 10a and 10b.

Because the frequency converter in accordance with this embodiment 3 thus has a balanced-type structure, receives the RF signal of positive phase and the other RF signal of negative phase, and outputs a differential signal that consists of mixed signals respectively including the RF signal of positive phase and the other RF signal of negative phase, the same advantage as offered by above-mentioned embodiment 1 is provided. The frequency converter in accordance with this embodiment 3 can further suppress the odd order harmonics of the RF signals, and a mixture of even order components of the LO signals and even order components of the RF signals, as compared with that of above-mentioned embodiment 1. Therefore, because the frequency converter in accordance with this embodiment 3 facilitates an output of a mixture wave of the second order components of the LO signals and the first order components of the RF signals, which can be general output signals from a harmonic mixer, and suppresses unnecessary spurious components, the structure of a filter circuit intended for reduction of spurious components and connected as an output stage of the frequency converter can be simplified.

The frequency converter in accordance with this embodiment 3 is not limited to the above-mentioned downconverter and can be alternatively an upconverter that outputs a differential signal consisting of both a mixed signal into which an IF signal of positive phase applied to the first RF signal input terminal instead of the RF signal of positive, the positive-phase signal having a frequency that is two times as high as that of the LO signals and generated by the first transistor pair 11a and the negative-phase signal flowing through the first reference transistor 3a are mixed, e.g., an RF signal having a frequency of $(f_{IF}+2f_{LO})$ ($f_{IF}$ is the frequency of the IF signal) and a mixed signal into which another IF signal of negative phase applied to the second RF signal input terminal instead of the other RF signal of negative phase, the positive-phase signal having a frequency that is two times as high as that of the LO signals and generated by the second transistor pair 11b and the negative-phase signal flowing through the second reference transistor 3b are mixed, e.g., an RF signal having a frequency of $(f_{IF}+2f_{LO})$ by way of the first and second output terminals 10a and 10b, respectively.

Figure 10:
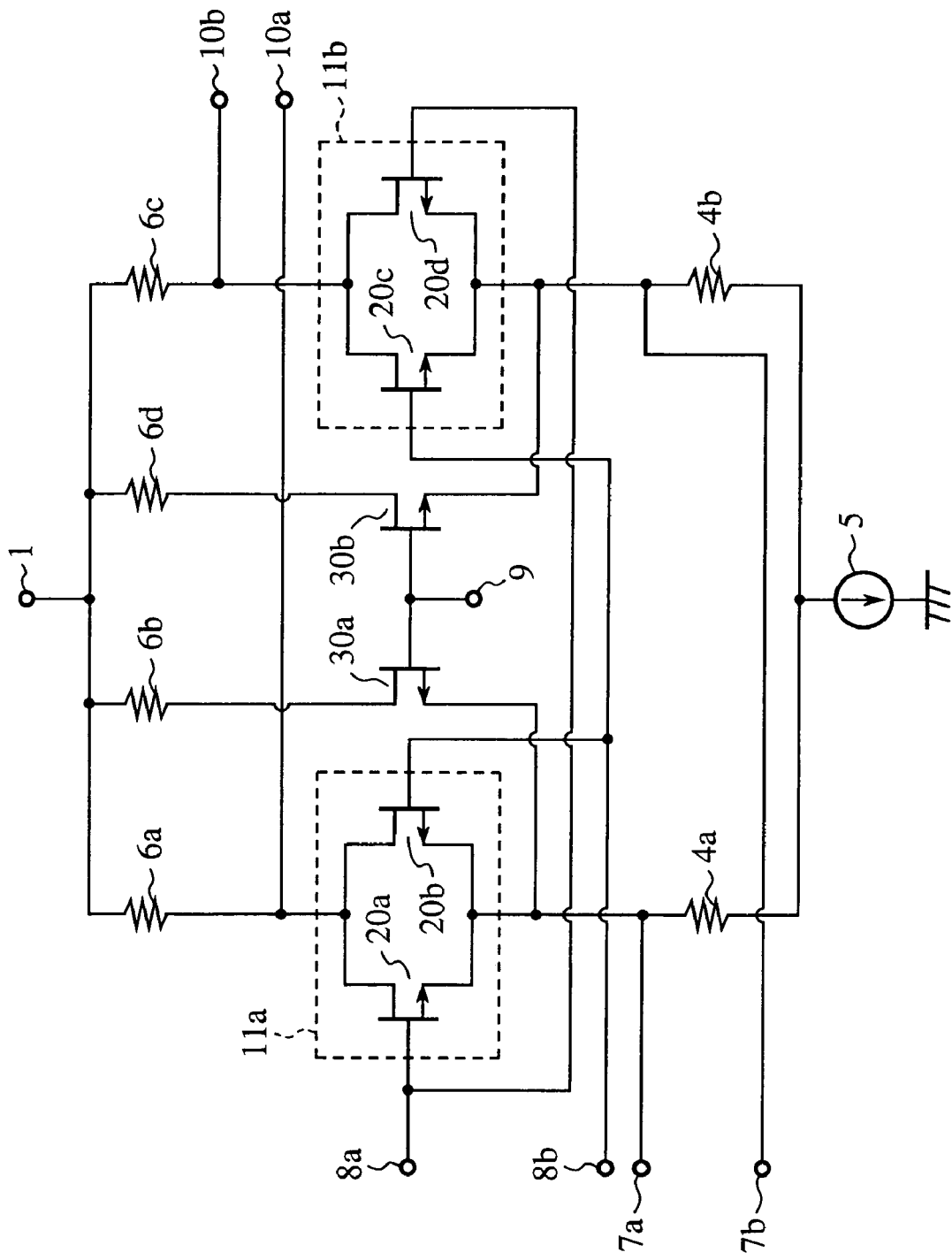
FIG. 10 is a schematic circuit diagram showing the structure of a frequency converter in accordance with a variant of embodiment 3 of the present invention.

Numerous variants can be made in this embodiment 3 mentioned above. FIG. 10 is a schematic circuit diagram showing the structure of a frequency converter in accordance with a variant of embodiment 3. In this variant, the first transistor pair 11a consists of two field-effect transistors 20a and 20b and the second transistor pair 11b consists of two field-effect transistors 20c and 20d, and reference field-effect transistors 30a and 30b each used for input of a reference signal are disposed instead of the first and second reference transistors 3a and 3b. In this case, the collector terminal, emitter terminal, and base terminal of each bipolar junction transistor of FIG. 9 are replaced by the drain terminal, source terminal, and gate terminal of each field-effect transistor.

Figure 11:
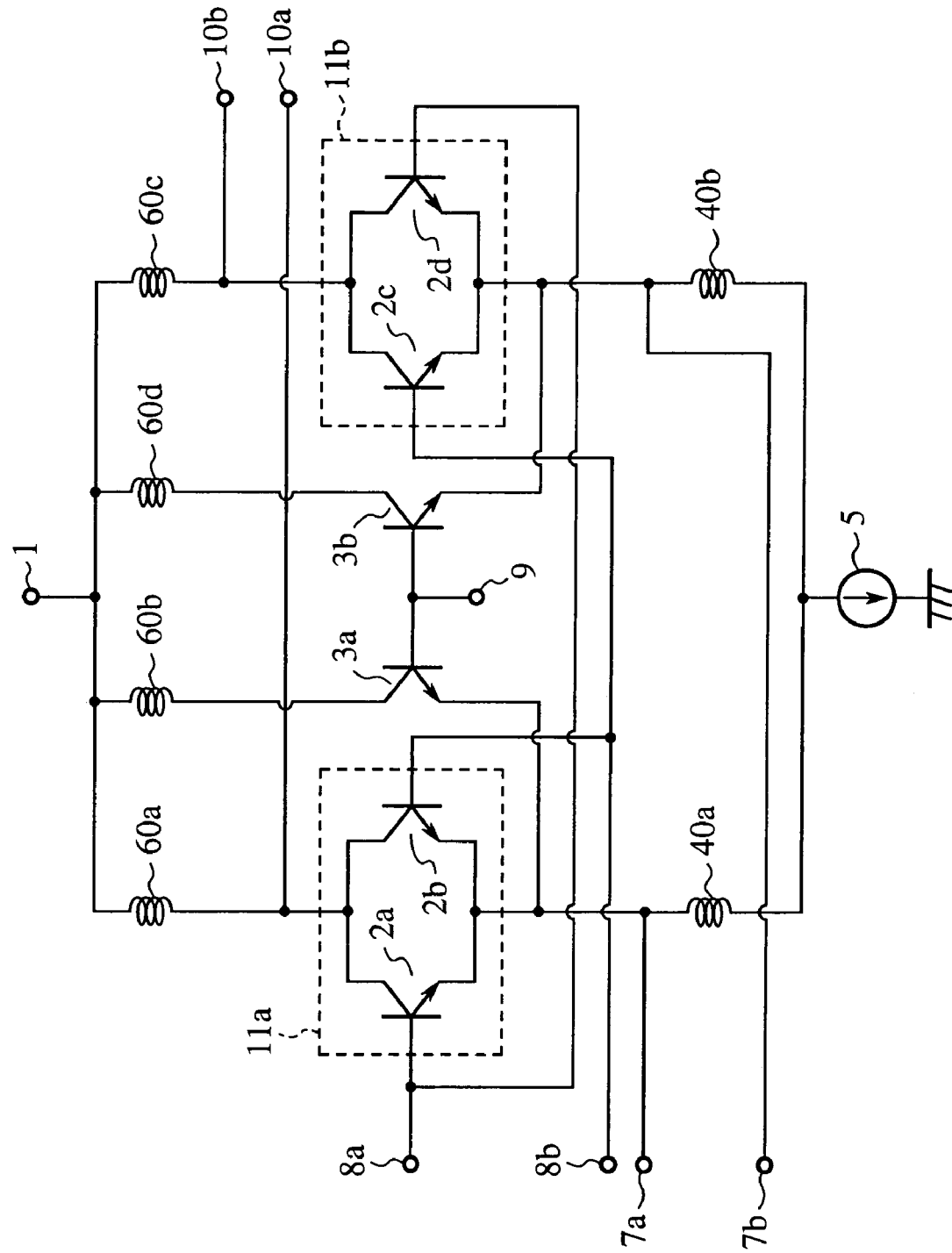
FIG. 11 is a schematic circuit diagram showing the structure of a frequency converter in accordance with another variant of embodiment 3 of the present invention.
Figure 12:
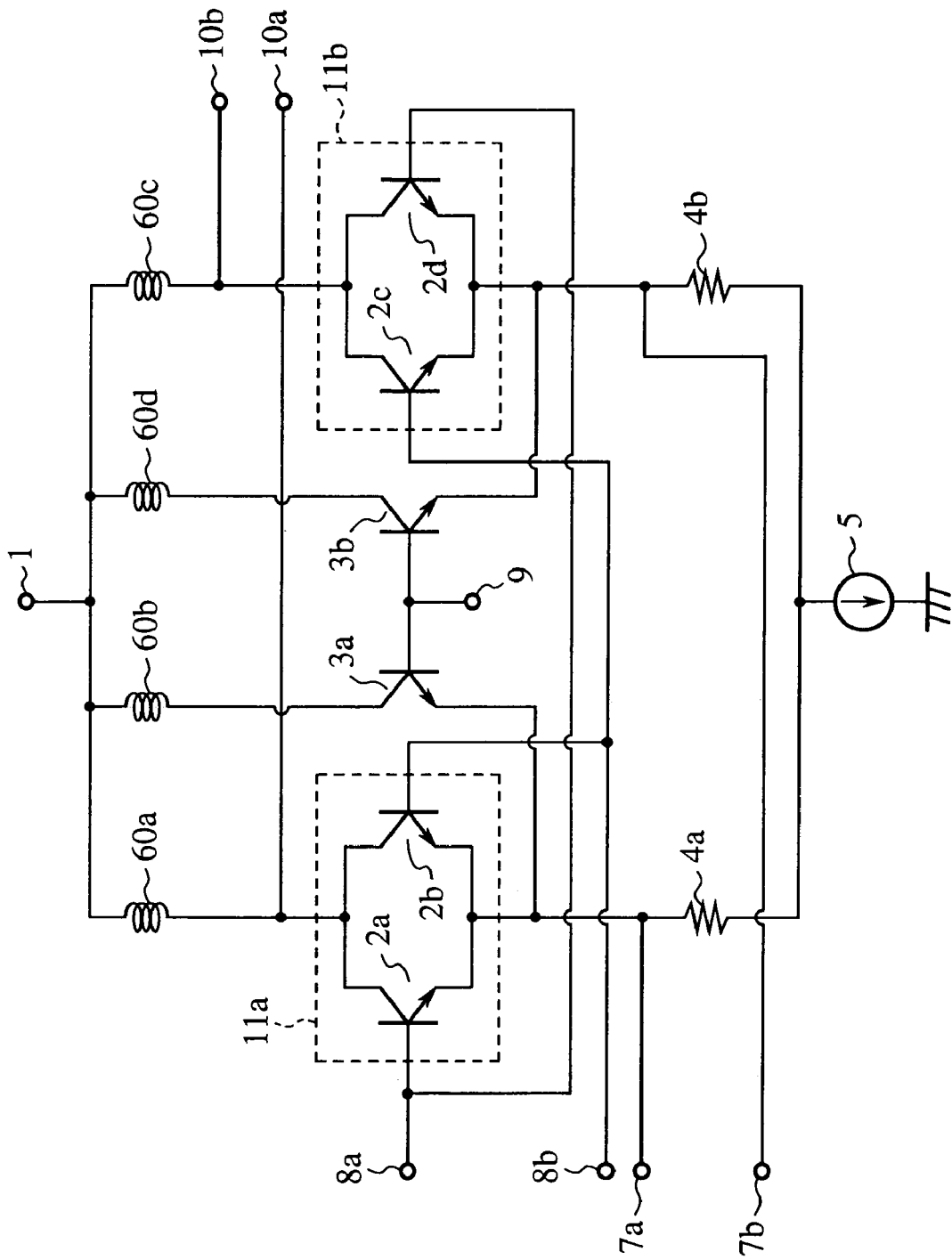
FIG. 12 is a schematic circuit diagram showing the structure of a frequency converter in accordance with another variant of embodiment 3 of the present invention.
Figure 13:
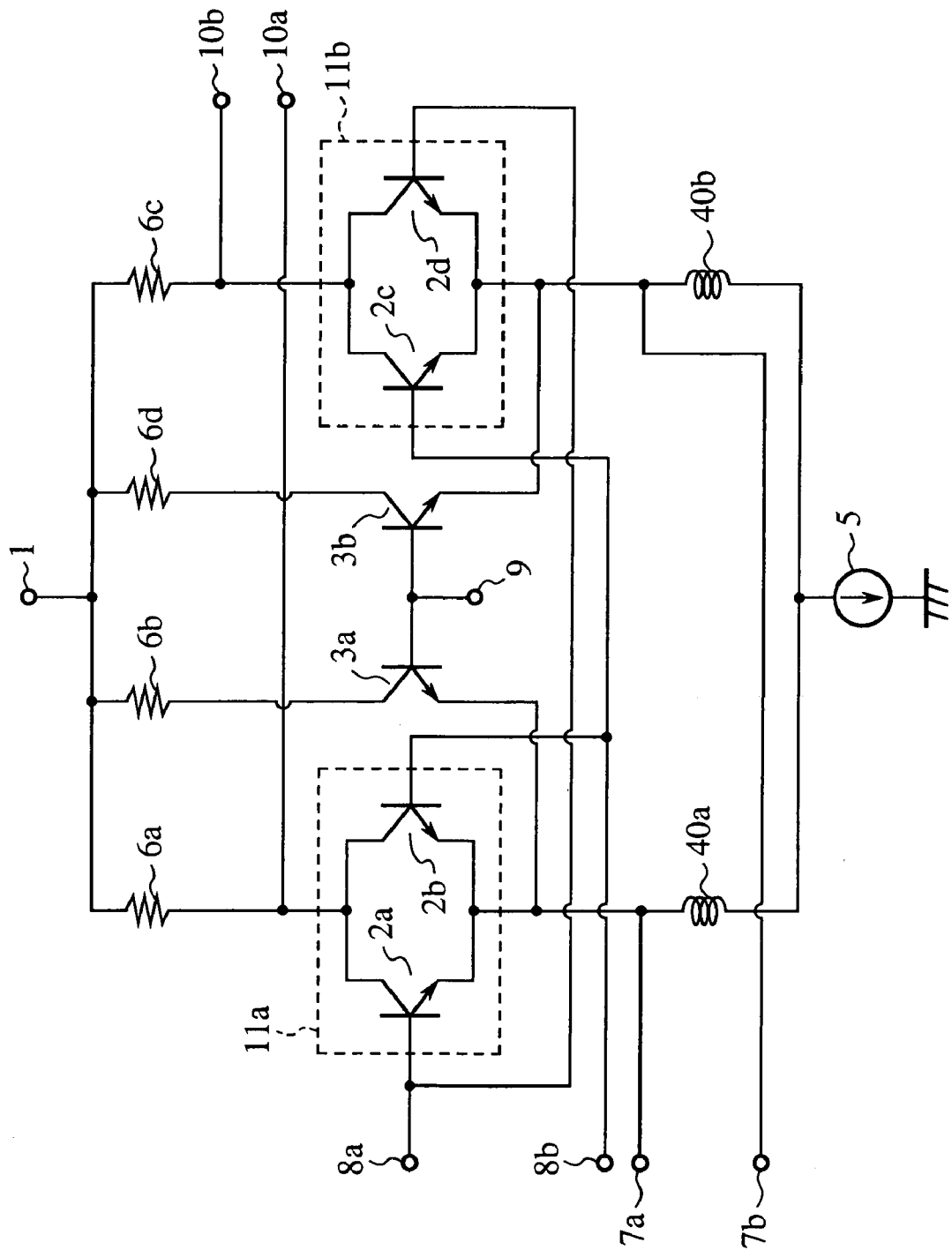
FIG. 13 is a schematic circuit diagram showing the structure of a frequency converter in accordance with another variant of embodiment 3 of the present invention.

FIG. 11 is a schematic circuit diagram showing the structure of a frequency converter in accordance with another variant of embodiment 3. In this variant, the load resistors 6a to 6d, and the RF signal input resistors 4a and 4b are replaced by inductors 60a to 60d, and 40a and 40b, respectively. As a result, even though a DC bias electric current increases, each transistor included in the frequency converter can be made to operate in a linear region without increase in the collector-emitter voltage of each transistor. All the resistors of the frequency converter need not be replaced by inductors. For example, as shown in FIGS. 12 and 13, only either of the load resistors 6a to 6d and the RF signal input resistors 4a and 4b may be replaced by inductors.

Figure 14:
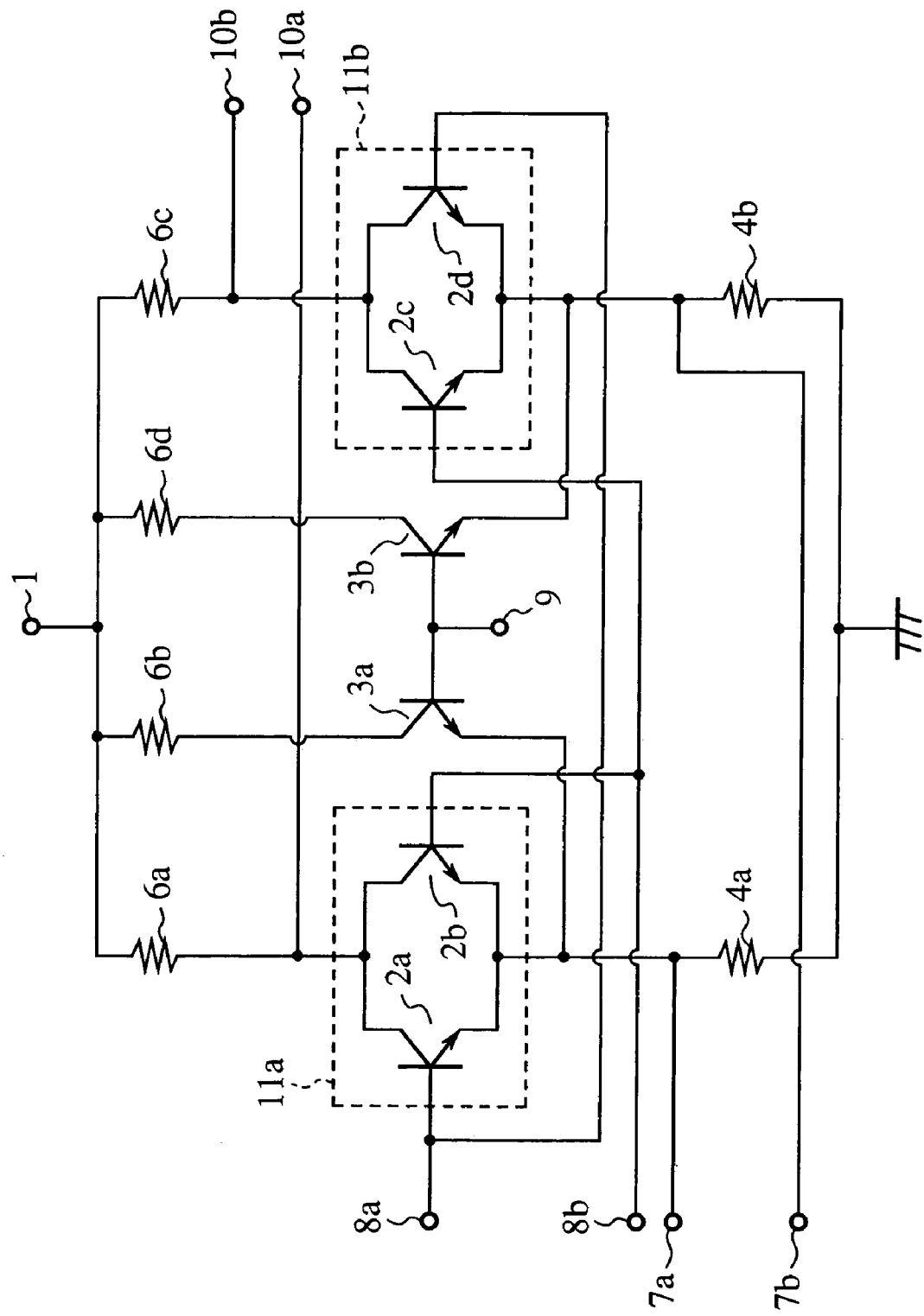
FIG. 14 is a schematic circuit diagram showing the structure of a frequency converter in accordance with another variant of embodiment 3 of the present invention.

FIG. 14 is a schematic circuit diagram showing the structure of a frequency converter in accordance with another variant of embodiment 3. In this variant, a constant current source 5 is omitted, and the other ends of the RF signal input resistors 4a and 4b are connected directly with the ground. Thus, even when the frequency converter does not include the constant current source 5, because an electric current flowing through a parallel circuit that consists of the first transistor pair 11a and the first reference transistor 3a is maintained constant by both the DC voltage Vcc applied to the power supply terminal 1 and the first RF signal input resistor 4a and an electric current flowing through another parallel circuit that consists of the second transistor pair 11b and the second reference transistor 3b is maintained constant by both the DC voltage Vcc applied to the power supply terminal 1 and the second RF signal input resistor 4b, the same advantage is provided.

Figure 15:
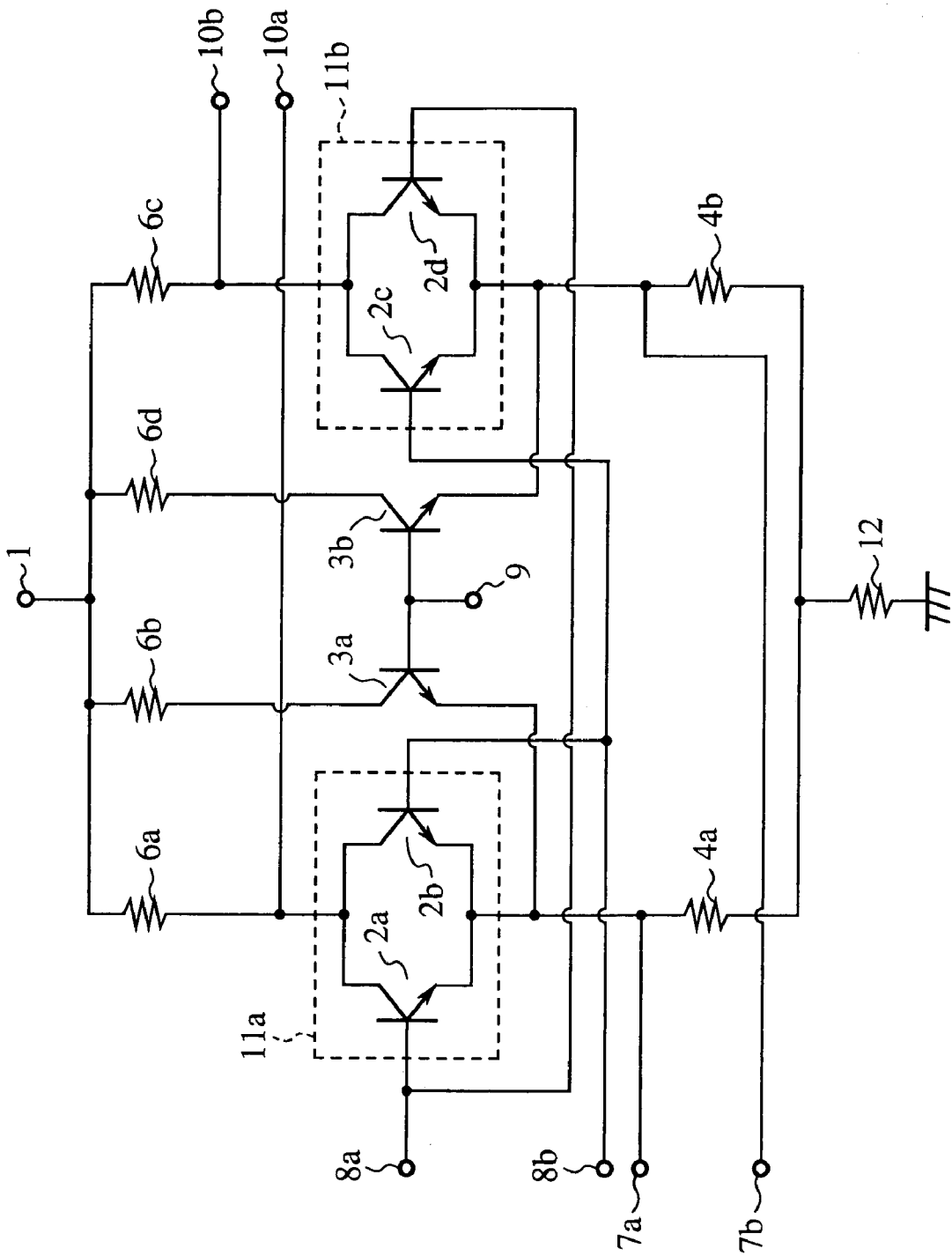
FIG. 15 is a schematic circuit diagram showing the structure of a frequency converter in accordance with another variant of embodiment 3 of the present invention.

FIG. 15 is a schematic circuit diagram showing the structure of a frequency converter in accordance with another variant of embodiment 3. In this variant, the constant current source 5 is replaced by a resistor 12. As a result, variations in the performance of the frequency converter due to temperature variations of the constant current source 5, which is usually constructed of a transistor, can be prevented.

Embodiment 4.

Figure 16:
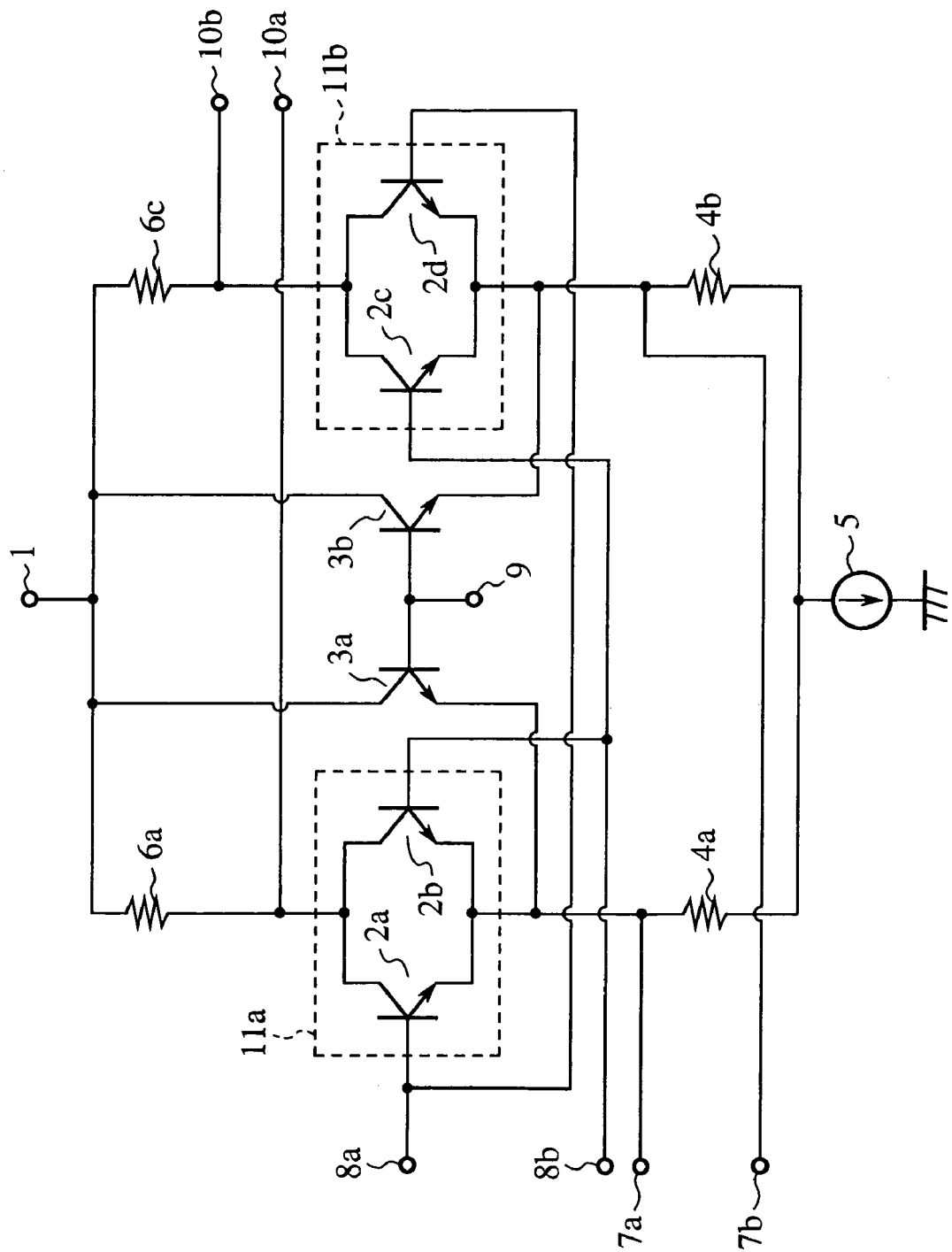
FIG. 16 is a schematic circuit diagram showing the structure of a frequency converter in accordance with embodiment 4 of the present invention.

FIG. 16 is a schematic circuit diagram showing the structure of a frequency converter in accordance with embodiment 4 of the present invention. In the figure, the same reference numerals as shown in FIG. 9 denotes the same components as those of the frequency converter in accordance with above-mentioned embodiment 3 or like components, and therefore the explanation of those components will be omitted hereafter.

The frequency converter in accordance with this embodiment 4 differs from that in accordance with above-mentioned embodiment 3 in that the load resistors 6b and 6d (i.e., fifth and sixth passive elements) as shown in FIG. 9 are omitted. In other words, the collector terminals of first and second reference transistors 3a and 3b are connected directly with a power supply terminal 1.

Next, a description will be made as to an operation of the frequency converter in accordance with embodiment 4 of the present invention.

The frequency converter in accordance with this embodiment 4 operates in the same way that that in accordance with above-mentioned embodiment 3 does. In other words, the frequency converter in accordance with this embodiment 4 outputs a differential signal byway of first and second output terminals 10a and 10b respectively connected to load resistors 6a and 6c, like that in accordance with above-mentioned embodiment 3.

Therefore, even though the frequency converter does not include the load resistors 6b and 6d as shown in FIG. 9, this embodiment 4 can provide the same advantage as offered by above-mentioned embodiment 3, and the circuit structure of the frequency converter can be simplified.

Numerous variants can be made in this embodiment 4, as in above-mentioned embodiment 3. In a variant, each of first and second transistor pairs 11a and 11b consists of two field-effect transistors, as in the case shown in FIG. 10, and reference field-effect transistors each used for input of a reference signal are disposed instead of the first and second reference transistors 3a and 3b. In this case, the collector terminal, emitter terminal, and base terminal of each bipolar junction transistor are replaced by the drain terminal, source terminal, and gate terminal of each field-effect transistor.

In another variant, as in the case shown in FIG. 11, the load resistors 6a to 6d, and RF signal input resistors 4a and 4b are replaced by inductors, respectively. As a result, even though a DC bias electric current increases, each transistor included in the frequency converter can be made to operate in a linear region without increase in the collector-emitter voltage of each transistor. All the resistors of the frequency converter need not be replaced by inductors, as in the cases shown in FIGS. 12 and 13, only either of the load resistors 6a to 6d and the RF signal input resistors 4a and 4b may be replaced by inductors.

In a further variant, as in the case shown in FIG. 14, a constant current source 5 is omitted and other ends of the RF signal input resistors 4a and 4b are connected directly with a ground. Thus, even when the frequency converter does not include the constant current source 5, because an electric current flowing through a parallel circuit that consists of the first transistor pair 11a and the first reference transistor 3a is maintained constant by both the DC voltage Vcc applied to the power supply terminal 1 and the first RF signal input resistor 4a and an electric current flowing through another parallel circuit that consists of the second transistor pair 11b and the second reference transistor 3b is maintained constant by both the DC voltage Vcc applied to the power supply terminal 1 and the second RF signal input resistor 4b, the same advantage is provided.

In another variant, as in the case shown in FIG. 15, the constant current source 5 is replaced by a resistor. As a result, variations in the performance of the frequency converter due to temperature variations of the constant cur-rent source 5, which is usually constructed of a transistor, can be prevented.

Embodiment 5.

Figure 17:
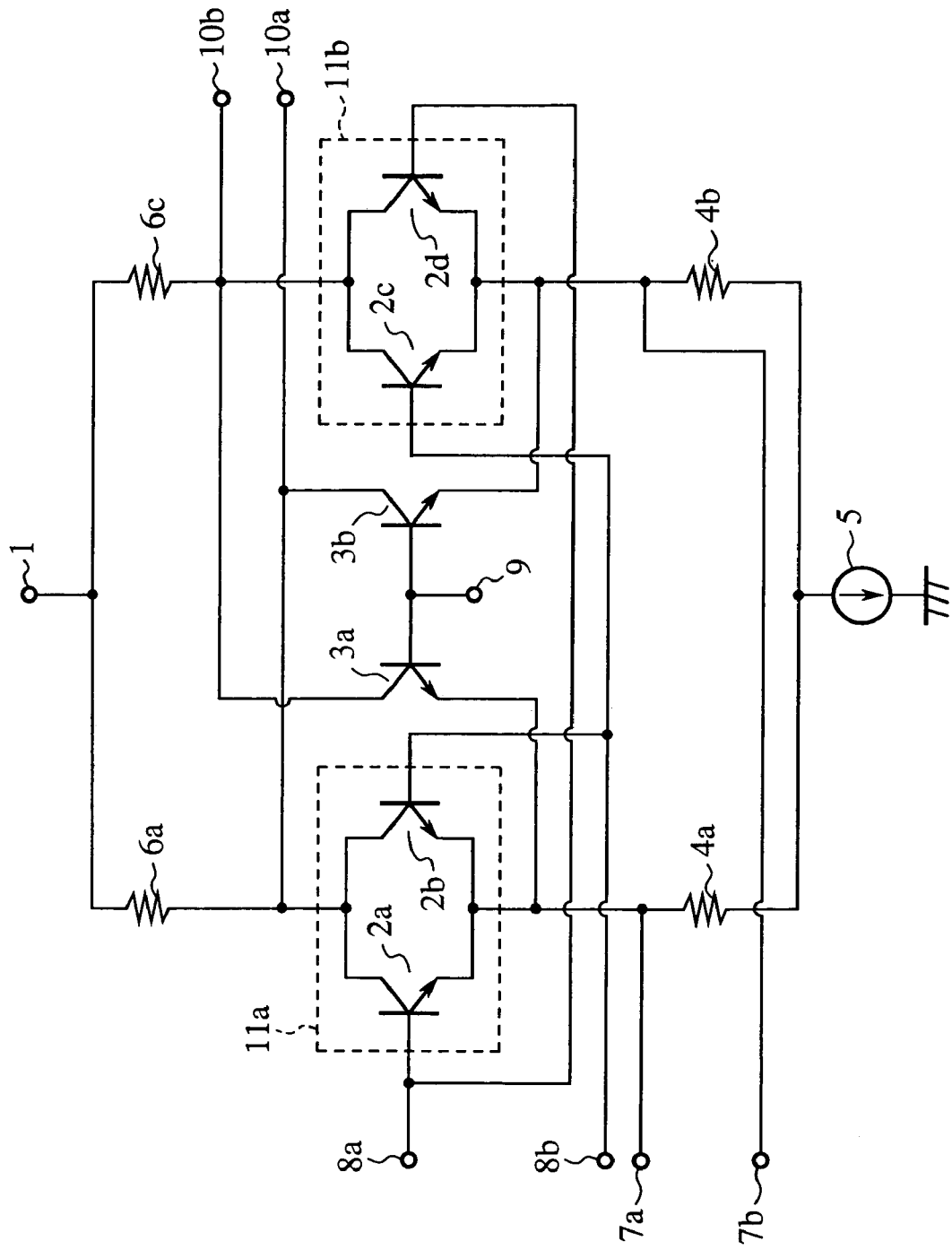
FIG. 17 is a schematic circuit diagram showing the structure of a frequency converter in accordance with embodiment 5 of the present invention.

FIG. 17 is a schematic circuit diagram showing the structure of a frequency converter in accordance with embodiment 5 of the present invention. In the figure, the same reference numerals as shown in FIG. 16 denotes the same components as those of the frequency converter in accordance with above-mentioned embodiment 4 or like components, and therefore the explanation of those components will be omitted hereafter.

Though the frequency converter in accordance with this embodiment 5 has a circuit structure similar to that of the frequency converter in accordance with above-mentioned embodiment 4, the frequency converter in accordance with this embodiment 5 differs from that in accordance with embodiment 4 in that a collector terminal of a first reference transistor 3a is connected to a second output terminal 10b, i.e., between a load resistor 6c and a common collector terminal of a second transistor pair 11b, and a collector terminal of a second reference transistor 3b is connected to a first output terminal 10a, i.e., between a load resistor 6a and a common collector terminal of a first transistor pair 11a.

Next, a description will be made as to an operation of the frequency converter in accordance with embodiment 5 of the present invention.

The frequency converter in accordance with this embodiment 5 operates basically in the same way that that in accordance with above-mentioned embodiment 4 does. Next, only a characterized operation of the frequency converter in accordance with this embodiment 5 will be explained.

In the frequency converter in accordance with above-mentioned embodiment 3 shown in FIG. 9, although the first and second reference transistors 3a and 3b suppress the second order components of LO signals, voltages that respectively appear at the collector terminals of the first and second reference transistors 3a and 3b vary according to electric currents that respectively flow through the resistors 6b and 6d. As a result, the second order components of the LO signals cannot be sufficiently suppressed. In contrast, in the frequency converter in accordance with this embodiment 5, because a voltage that appears at a common collector terminal of the first transistor pair 11a is equal to a voltage that appears at a collector terminal of the second reference transistor 3b regardless of an electric current that flows through the resistor 6a and a voltage that appears at a common collector terminal of the second transistor pair 11b is equal to a voltage that appears at a collector terminal of the first reference transistor 3a regardless of an electric current that flows through the resistor 6c, the appearance of the second order components of the LO signals at the first and second output terminals 10a and 10b can be further suppressed.

As mentioned above, this embodiment 5 provides the same advantage as offered by above-mentioned embodiment 4, and an advantage of further suppressing the appearance of the second order components of the LO signals at the first and second output terminals 10a and 10b.

Numerous variants can be made in this embodiment 5, as in above-mentioned embodiment 3. In a variant, each of first and second transistor pairs 11a and 11b consists of two field-effect transistors, as in the case shown in FIG. 10, and reference field-effect transistors each used for input of a reference signal are disposed instead of the first and second reference transistors 3a and 3b. In this case, the collector terminal, emitter terminal, and base terminal of each bipolar junction transistor are replaced by the drain terminal, source terminal, and gate terminal of each field-effect transistor.

In another variant, as in the case shown in FIG. 11, the load resistors 6a to 6d, and RF signal input resistors 4a and 4b are replaced by inductors, respectively. As a result, even though the DC bias electric current increases, each transistor included in the frequency converter can be made to operate in a linear region without increase in the collector-emitter voltage of each transistor. All the resistors of the frequency converter need not be replaced by inductors, as in the cases shown in FIGS. 12 and 13, only either of the load resistors 6a to 6d and the RF signal input resistors 4a and 4b may be replaced by inductors.

In a further variant, as in the case shown in FIG. 14, a constant current source 5 is omitted and other ends of the RF signal input resistors 4a and 4b are connected directly with a ground. Thus, even when the frequency converter does not include the constant current source 5, because an electric current flowing through an entire parallel circuit that consists of the first transistor pair 11a and the first reference transistor 3a is maintained constant by both the DC voltage Vcc applied to the power supply terminal 1 and the first RF signal input resistor 4a and an electric current flowing through an entire parallel circuit that consists of the second transistor pair 11b and the second reference transistor 3b is maintained constant by both the DC voltage Vcc applied to the power supply terminal 1 and the second RF signal input resistor 4b, the same advantage is provided.

In another variant, as in the case shown in FIG. 15, the constant current source 5 is replaced by a resistor. As a result, variations in the performance of the frequency converter due to temperature variations of the constant current source 5, which is usually constructed of a transistor, can be prevented.

INDUSTRIAL APPLICABILITY

As mentioned above, the frequency converter in accordance with the present invention is suitable for multiplying the frequency of a high-frequency signal, such as a UHF, microwave, or millimeter wave, by a certain factor, or mixing high-frequency signals with each other in a wide-band communication terminal or the like that conforms to a communication system such as a WCDMA system.

What is claimed is:

1. A frequency converter comprising:
a transistor pair having a first transistor and a second transistor respectively having first terminals commonly connected to each other as a first common terminal and second terminals commonly connected to each other as a second common terminal, the commonly-connected first terminals being connected to a power supply terminal by way of a first passive element;
a third transistor having a first terminal connected to said power supply terminal by way of a second passive element, and a second terminal connected to the commonly-connected second terminals of said first and second transistors of said transistor pair;
a third passive element having an end connected to the second common terminal of said transistor pair, and another end directly or indirectly grounded; and
an output terminal connected to the first common terminal of said transistor pair, a first signal being applied to a third terminal of said first transistor, a second signal having a phase opposite to that of the first signal being applied to a third terminal of said second transistor, a third signal being applied to the second common terminal of said transistor pair, and a reference signal being applied to a third terminal of said third transistor.

2. The frequency converter according to claim 1, wherein said converter further comprises another output terminal connected to the first terminal of said third transistor.

3. The frequency converter according to claim 1, wherein said first to third passive elements are resistors.

4. The frequency converter according to claim 1, wherein said first to third passive elements are inductors.

5. The frequency converter according to claim 1, wherein said converter further comprises a constant current source connected between the other end of said third passive element and a ground.

6. The frequency converter according to claim 1, wherein each of the first to third transistors is a bipolar junction transistor having a collector terminal as the first terminal, an emitter terminal as the second terminal, and a base terminal as the third terminal.

7. The frequency converter according to claim 1, wherein each of the first to third transistors is a field effect transistor having a drain terminal as the first terminal, a source terminal as the second terminal, and a gate terminal as the third terminal.

8. A frequency converter comprising:
a first transistor pair having a first transistor and a second transistor respectively having first terminals commonly connected to each other as a first common terminal of said first transistor pair and second terminals commonly connected to each other as a second common terminal of said first transistor pair, the commonly-connected first terminals being connected to a power supply terminal by way of a first passive element;
a third transistor having a first terminal directly or indirectly connected to said power supply terminal, and a second terminal connected to the commonly-connected second terminals of said first and second transistors of said first transistor pair;
a second passive element having an end connected to the second common terminal of said first transistor pair, and another end directly or indirectly grounded;
a first output terminal connected to the first common terminal of said first transistor pair;
a second transistor pair having a fourth transistor and a fifth transistor respectively having first terminals commonly connected to each other as a first common terminal of said second transistor pair and second terminals commonly connected to each other as a second common terminal of said second transistor pair, the commonly-connected first terminals being connected to said power supply terminal by way of a third passive element;
a sixth transistor having a first terminal directly or indirectly connected to said power supply terminal, and a second terminal connected to the commonly-connected second terminals of said fourth and fifth transistors of said second transistor pair;
a fourth passive element having an end connected to the second common terminal of said second transistor pair, and another end directly or indirectly grounded; and
a second output terminal connected to the first common terminal of said second transistor pair, a first signal being applied to third terminals of said first and fifth transistors, a second signal having a phase opposite to that of the first signal being applied to third terminals of said second and fourth transistors, a third signal being applied to the second common terminal of said first transistor pair, a fourth signal having a phase opposite to that of the third signal being applied to the second common terminal of said second transistor pair, and a reference signal being applied to third terminals of said third and sixth transistors.

9. The frequency converter according to claim 8, wherein the first terminal of said third transistor is connected to said power supply terminal by way of said fifth passive element, and the first terminal of said sixth transistor is connected to said power supply terminal by way of said sixth passive element.

10. The frequency converter according to claim 8, wherein the first terminal of said third transistor is connected to said second output terminal and is also connected to said power supply terminal by way of said third passive element, and the first terminal of said sixth transistor is connected to said first output terminal and is also connected to said power supply terminal by way of said first passive element.

11. The frequency converter according to claim 8, wherein said first to fourth passive elements are resistors.

12. The frequency converter according to claim 8, wherein said first to fourth passive elements are inductors.

13. The frequency converter according to claim 9, wherein said first to sixth passive elements are resistors.

14. The frequency converter according to claim 9, wherein said first to sixth passive elements are inductors.

15. The frequency converter according to claim 8, wherein said converter comprises a constant current source connected between the other ends of said second and fourth passive elements and a ground.

16. The frequency converter according to claim 8, wherein said converter further comprises a resistor connected between the other ends of said second and fourth passive elements and a ground.

17. The frequency converter according to claim 8, wherein each of the first to sixth transistors is a bipolar junction transistor having a collector terminal as the first terminal, an emitter terminal as the second terminal, and a base terminal as the third terminal.

18. The frequency converter according to claim 8, wherein each of the first to sixth transistors is a field effect transistor having a drain terminal as the first terminal, a source terminal as the second terminal, and a gate terminal as the third terminal.

* * * * *